United States Patent
Han et al.

(10) Patent No.: US 9,721,762 B2
(45) Date of Patent: Aug. 1, 2017

(54) METHOD AND SYSTEM MANAGING EXECUTION OF PREVENTATIVE MAINTENANCE OPERATION IN SEMICONDUCTOR MANUFACTURING EQUIPMENT

(71) Applicant: SAMSUNG ELECTRONICS CO., LTD., Suwon-si, Gyeonggi-do (KR)

(72) Inventors: Kyounghoon Han, Seoul (KR); Byungbok Kang, Yongin-si (KR); Namjun Kang, Bucheon-si (KR); Tae-Hwa Kim, Hwaseong-si (KR); Junghyun Cho, Suwon-si (KR); Jae-Hyun Lee, Yongin-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 497 days.

(21) Appl. No.: 14/473,554

(22) Filed: Aug. 29, 2014

(65) Prior Publication Data

US 2015/0198944 A1 Jul. 16, 2015

(30) Foreign Application Priority Data

Jan. 13, 2014 (KR) .................. 10-2014-0004095

(51) Int. Cl.
*G06F 19/00* (2011.01)
*H01J 37/32* (2006.01)
*G05B 23/02* (2006.01)

(52) U.S. Cl.
CPC .... *H01J 37/32394* (2013.01); *G05B 23/0283* (2013.01); *G05B 2219/45031* (2013.01); *Y02P 90/14* (2015.11); *Y02P 90/18* (2015.11)

(58) Field of Classification Search
CPC .......... H01J 37/32935; H01J 37/32082; H01J 37/32165; H01J 37/321; H01J 37/32394; C23C 16/40; C23C 16/4404
See application file for complete search history.

(56) References Cited

U.S. PATENT DOCUMENTS

| | | |
|---|---|---|
| 6,701,202 B2 | 3/2004 | Nakano et al. |
| 6,929,712 B2 | 8/2005 | Hanazaki et al. |
| 7,554,334 B2 | 6/2009 | Shannon et al. |
| 7,737,706 B2 | 6/2010 | Yamazawa |

(Continued)

FOREIGN PATENT DOCUMENTS

| | | |
|---|---|---|
| JP | 2006066552 A | 3/2006 |
| KR | 20050053698 A | 6/2005 |
| KR | 20060059550 A | 6/2006 |

*Primary Examiner* — Tuan Vu
(74) *Attorney, Agent, or Firm* — Volentine & Whitt, PLLC

(57) ABSTRACT

Provided are a method and a system for managing semiconductor manufacturing equipment. The method may be performed using an equipment computer and may include ordering to perform a preventive maintenance to a chamber and parts in the chamber, monitoring a result of the preventive maintenance to the chamber and the parts, and performing a manufacturing process using plasma reaction in the chamber, if the result of the preventive maintenance is normal. The monitoring the result of the preventive maintenance may include a pre-screening method monitoring the result of the preventive maintenance using electric reflection coefficients obtained from the chamber and the parts without using the plasma reaction.

19 Claims, 8 Drawing Sheets

(56) References Cited

U.S. PATENT DOCUMENTS

| | | | |
|---|---|---|---|
| 7,908,104 B2 | 3/2011 | Tetsuka et al. | |
| 2002/0179577 A1* | 12/2002 | Koshimizu | H01J 37/32165 |
| | | | 219/121.43 |
| 2003/0052085 A1* | 3/2003 | Parsons | H01J 37/32082 |
| | | | 216/60 |
| 2004/0055868 A1* | 3/2004 | O'Leary | H01J 37/32935 |
| | | | 204/157.15 |
| 2004/0060660 A1* | 4/2004 | Klimecky | H01J 37/321 |
| | | | 156/345.28 |
| 2006/0065632 A1* | 3/2006 | Cheng | H01J 37/32082 |
| | | | 216/86 |
| 2007/0215282 A1 | 9/2007 | Itabashi et al. | |
| 2007/0281105 A1* | 12/2007 | Mokhlesi | C23C 16/40 |
| | | | 427/569 |
| 2008/0011425 A1* | 1/2008 | Nishio | C23C 16/4404 |
| | | | 156/345.48 |
| 2010/0148769 A1 | 6/2010 | Choi et al. | |
| 2010/0258529 A1 | 10/2010 | Mori et al. | |
| 2010/0332201 A1* | 12/2010 | Albarede | H01J 37/32935 |
| | | | 703/2 |
| 2014/0197731 A1* | 7/2014 | Valcore, Jr. | H01J 37/32935 |
| | | | 315/111.21 |

\* cited by examiner

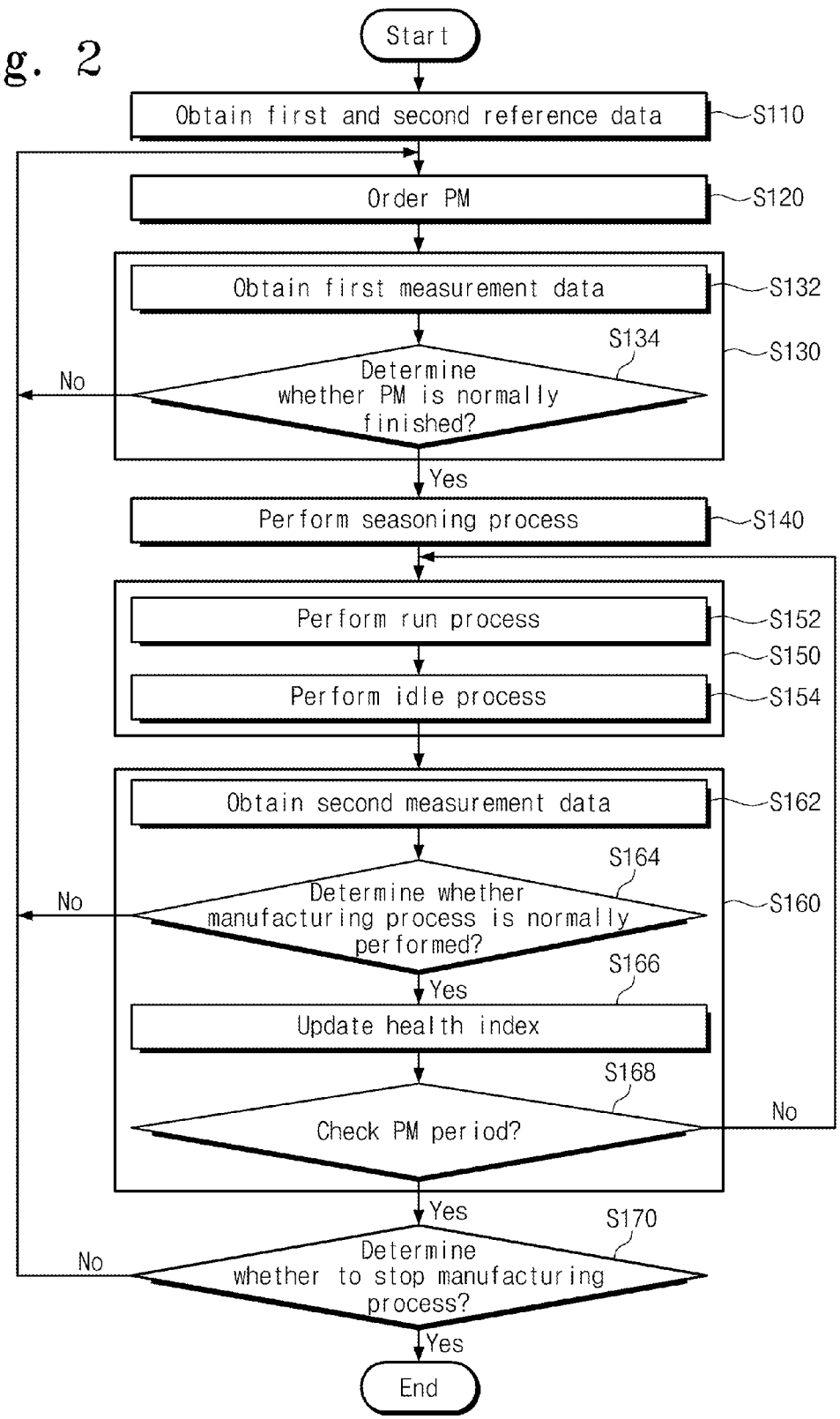

METHOD AND SYSTEM MANAGING EXECUTION OF PREVENTATIVE MAINTENANCE OPERATION IN SEMICONDUCTOR MANUFACTURING EQUIPMENT

CROSS-REFERENCE TO RELATED APPLICATIONS

This U.S. non-provisional patent application claims priority under 35 U.S.C. §119 to Korean Patent Application No. 10-2014-0004095 filed on Jan. 13, 2014, the subject matter of which is hereby incorporated by reference.

BACKGROUND

The inventive concept relates generally to the management of semiconductor manufacturing equipment.

The manufacture of semiconductor devices is a highly complex endeavor involving the design and execution of many different processes, such as thin-film deposition, photolithography, etching, cleaning, etc. Many thin-film deposition processes and etching processes require the use of a "plasma reaction". In general, a plasma reaction involves the generation of charged ions from a source gas, followed by the direction the charged ions towards a wafer (or wafer portion) on which one or more semiconductor devices is being manufactured.

However, the generation and/or use of certain plasma reactions may lead to the development of unwanted residues on the inner surface(s) and/or parts of a chamber in which the plasma reaction is performed. Certain polymeric residues, for example, may accumulate on chamber surfaces and parts to the point where the efficiency of subsequent manufacturing processes performed in a "contaminated" chamber may be markedly reduced. Accordingly, chambers used to generate plasma reactions must be subjected to routine preventive maintenance.

Unfortunately, routine preventive maintenance can be costly, is sometimes less than fully effective, and always results in at least some equipment downtime. Thus, while necessary to ensure the successful execution of subsequently performed manufacturing processes, routine preventive maintenance must be managed judiciously to minimize cost and interruption of equipment use, and should be carefully monitored to ensure effectiveness.

SUMMARY

Embodiments of the inventive concept provide methods and systems that manage the execution of a preventative maintenance operation for a chamber in an arrangement of semiconductor manufacturing equipment. Here, methods and systems may be configured to check the results of the preventive maintenance operation in the absence of a plasma reaction.

In one embodiment, the inventive concept provides a method of managing semiconductor manufacturing equipment using an equipment computer. The method comprises; ordering a preventive maintenance operation for a chamber, determining whether or not the preventive maintenance operation was normally finished using electric reflection coefficients obtained in relation to the chamber in the absence of a plasma reaction, and then only after determining that the preventive maintenance operation was normally finished, performing a semiconductor manufacturing process using a plasma reaction in the chamber.

In another embodiment, the inventive concept provides a management system for semiconductor manufacturing equipment, comprising; semiconductor manufacturing equipment including a chamber and a related electrical part, an electric reflection coefficient measuring instrument external to the chamber and connected to the electrical part to provide a control signal, and an equipment computer configured to control execution of a preventative maintenance operation for the chamber using at least one frequency map obtained by providing the control signal to the electrical part with a respective frequency exhibiting a peak value in related to an electric reflection coefficient associated with the part.

In another embodiment, the inventive concept provides a method of managing the application of a preventative maintenance operation to a chamber in an assembly of semiconductor manufacturing equipment. The method comprises; before running a semiconductor manufacturing operation, ordering a preventive maintenance operation for a chamber, then determining whether or not the preventive maintenance operation was normally finished using electric reflection coefficients obtained in relation to the chamber in the absence of a plasma reaction, after running the semiconductor manufacturing operation, ordering the preventive maintenance operation for the chamber upon determining that the semiconductor manufacturing operation was not normally performed, and then determining whether or not the preventive maintenance operation was normally finished using electric reflection coefficients obtained in relation to the chamber in the absence of a plasma reaction, and after running the semiconductor manufacturing operation, ordering the preventive maintenance operation for the chamber upon determining that a period for the preventive maintenance operation has been reached, and then determining whether or not the preventive maintenance operation was normally finished using electric reflection coefficients obtained in relation to the chamber in the absence of a plasma reaction.

BRIEF DESCRIPTION OF THE DRAWINGS

Certain embodiments of the inventive concept will be more clearly understood from the following description taken in conjunction with the accompanying drawings.

FIG. 2 is a flow chart summarizing in one example a method of managing the use and preventative maintenance of semiconductor manufacturing equipment according to certain embodiments of the inventive concept.

Figure 1:
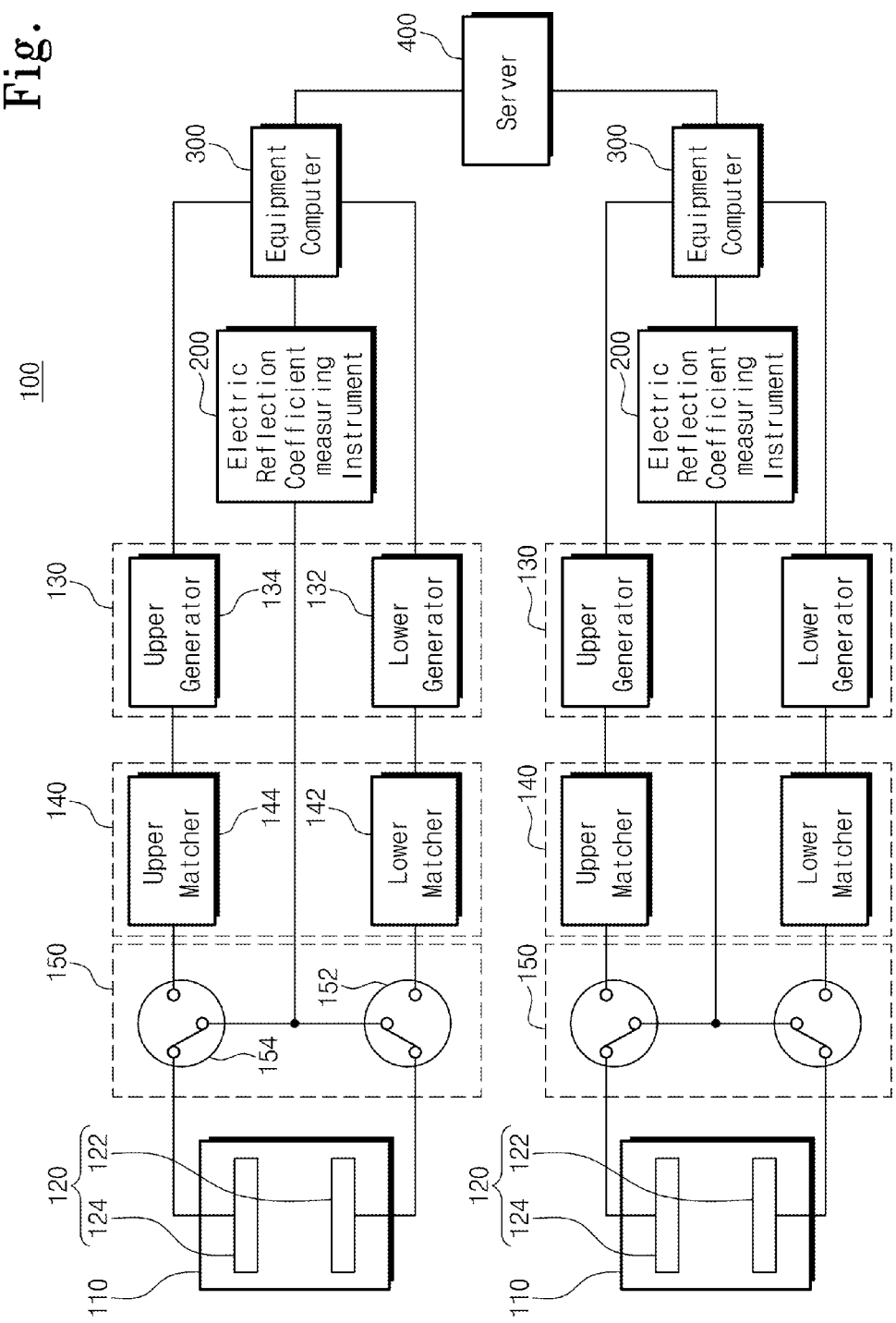
FIG. 1 is a block diagram illustrating a semiconductor manufacturing system according to embodiments of the inventive concept.

It should be noted that the various figures in the drawings are intended to illustrate general characteristics of certain methods, structures and/or materials that may be utilized in the making and use of various embodiments of the inventive concept. As such, the drawings supplement the written description provided hereafter. These drawings are not necessarily done to scale and may not precisely reflect the structural and/or performance characteristics of any given embodiment. Thus, the drawings should not be interpreted as defining or limiting a particular range of values or properties encompassed by example embodiments. For example, the relative thickness(es) and positioning of molecules, layers, regions and/or structural elements may be reduced or exaggerated for clarity. The use of similar or identical reference numbers in the various drawings is intended to indicate the presence of a similar or identical element(s) and/or feature(s).

DETAILED DESCRIPTION

Embodiments of the inventive concept will now be described in some additional detail with reference to the accompanying drawings. The inventive concept may, however, be variously embodied and should not be construed as being limited to only the illustrated embodiments. Rather, these embodiments are provided so that this disclosure will be thorough and complete, and will fully convey the concept of example embodiments to those of ordinary skill in the art.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. As used herein the term "and/or" includes any and all combinations of one or more of the associated listed items. Other words used to describe the relationship between elements or layers should be interpreted in a like fashion (e.g., "between" versus "directly between," "adjacent" versus "directly adjacent," "on" versus "directly on").

It will be understood that, although the terms "first", "second", etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of example embodiments.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises", "comprising", "includes" and/or "including," if used herein, specify the presence of stated features, integers, steps, operations, elements and/or components, but do not preclude the presence or addition of one or more other features, integers, steps, operations, elements, components and/or groups thereof.

Unless otherwise defined, all terms (including technical and scientific terms) used herein have the same meaning as commonly understood by one of ordinary skill in the art to which example embodiments of the inventive concepts belong. It will be further understood that terms, such as those defined in commonly-used dictionaries, should be interpreted as having a meaning that is consistent with their meaning in the context of the relevant art and will not be interpreted in an idealized or overly formal sense unless expressly so defined herein.

FIG. 1 is a block diagram illustrating a semiconductor manufacturing system 100 according to an embodiment of the inventive concept.

Referring to FIG. 1, the semiconductor manufacturing system 100 comprises; reflection coefficient measuring instruments 200, equipment computers 300, and a server 400. The semiconductor manufacturing system 100 is assumed to be configurable in such a manner that one or more semiconductor manufacturing process(es) may be performed using plasma reaction.

The example illustrated in FIG. 1 shows two chambers 110 capable of generating a plasma reaction along with related components, each chamber 110 being respectively arranged with a corresponding electric reflection coefficient measuring instrument 200 and equipment computer 300. Multiple equipment computers may be operatively connected to a single server 400, for example. However, those skilled in the art will understand that more than two chambers and related components may be managed in a semiconductor manufacturing system according to embodiments of the inventive concept.

Further, the respective chamber 110 may be used to perform various thin-layer deposition, etching, and/or ashing process(es). For the sake of simplicity of explanation, various components routinely used in conjunction with semiconductor manufacturing process chambers are generally indicated in FIG. 1 as electrical parts 120, generators 130, matchers 140, and switches 150. Those skilled in the art will recognize that these types of components (and many similar components) may be variously arranged in conjunction with the use of different chambers 110. As such, these components are subject to plasma reaction contamination which must be addressed by competent preventative maintenance.

Thus, each chamber 110 may be configured to provide a "processing space" isolated from the surrounding environment. This processing space is often used to hold a vacuum (or very low) pressure, as provided by connection of the chamber 110 to various gas sources, vacuum pumps, etc.

Different and various electrical parts 120 may be used to generate a plasma field in the chamber 110 using one or more high-frequency power sources. Some electrical parts 120 will include a lower electrode 122 and an upper electrode 124, for example. Other commonly used electrical parts 120 include; chuck(s), edge ring(s), etc. provided in relation to one or both of the lower electrode 122 and upper electrode 124.

One or more generators 130 may be used to produce the high-frequency power necessary to generate a plasma field. For example, a lower generator 132 may be used to drive and be connected to the lower electrode 122, and an upper generator 134 may be used to drive and be connected to the upper electrode 124.

One or more matchers 140 may be used to "match" impedances between certain electrical parts 120 and correspondingly connected generators 130. The use of the matchers 140 facilitate the maximizing of the high-frequency power applied via the electrical parts 120. Here, a lower matcher 142 and an upper matcher 144 are used in respective conjunction with the lower electrode 122/lower generator 132 and the upper electrode 124/upper generator 134.

One or more switches 150 may be used to selectively connect the high-frequency power source(s) with the electrical part(s) 120 via the matcher(s) 140. In this exemplary manner, high-frequency power may be generated in a controlled manner in order to induce a plasma reaction in a corresponding chamber 110.

In certain embodiments of the inventive concept, the one or more switches 150 may be used to selectively connect (i.e., turn ON/OFF) a high-frequency signal applied to the electrical parts 120 in response to a control signal provided by a reflection coefficient measuring instrument 200.

That is, each electric reflection coefficient measuring instrument 200 may be configured to make measurement(s) in relation to one or more electric reflection coefficients associated with the electrical parts 120. This measurement process by the electric reflection coefficient measuring instrument 200 may be performed in relation to the electrical parts 120 during "idle periods" when no plasma reaction is being generated in a chamber 110. As will be described in some additional detail hereafter, the one or more electric reflection coefficient(s) controlling the measurement process will vary with applied control signal frequency. Thus, the electrical parts 120 may be configured in such a way that corresponding electric reflection coefficient(s) exhibit a peak value in response to a specific control signal frequency. In this manner, each one of the electrical parts 120 may exhibit a peculiar electric reflection coefficient.

Each equipment computer 300 may be configured to monitor the state of a chamber 110 and associated components in relation to electric reflection coefficients. For example, an equipment computer 300 may be configured to determine whether or not a coupling failure (or operational failure) has occurred between the chamber 110 and one or more of the electrical parts 120 based on respective, electric reflection coefficient measurement data.

Thus, during an idle period for the chamber 110, a corresponding equipment computer 300 may operate (i.e., execute a software program stored in a memory accessible by the equipment computer 300) to obtain "electric reflection coefficient (ERC) measurement data" related to certain predetermined electric reflection coefficients respectively associated with different electrical parts 120. Then, the equipment computer 300 may compare the ERC measurement data with related reference data in order to control the application, timing and/or definition of preventive maintenance operations applied to the chamber 110 and/or the electrical parts 120 based on the comparison. It should be noted here that an equipment computer 300 may be the same equipment computer routinely used to control the execution of various semiconductor manufacturing process(es) conducted in a corresponding chamber 110. Hence, no new computational device need be provided to control the application of one or more preventive maintenance operations.

The server 400 may receive, share, store and/or communicate information, such as the ERC measurement data, generated across the semiconductor manufacturing equipment 100 by (e.g.,) the equipment computers 300 using the conventionally understood SEMI Equipment Communications Standard (SECS) protocol, Transmission Control Protocol/Internet Protocol (TCP/IP), etc.

FIG. 2 is a flow chart summarizing in one example a method of managing semiconductor manufacturing equipment according to certain embodiments of the inventive concept.

Referring to FIGS. 1 and 2, each one of the two (2) equipment computers 300 shown in FIG. 1 may be used during one or more idles periods for the chambers 110 to respectively obtain first reference data and second reference data relation to a corresponding chamber 110 and associated electrical parts 120 (S110). Here, the first reference data and second reference data may be various ERC measurement data obtained using the respective electric reflection coefficient measuring instruments 200.

The first reference data may be obtained during an initial stage of setting-up the semiconductor manufacturing equipment 100. That is, the first reference data may include electric reflection coefficients obtained from a chamber 110 and related electrical parts 120 as initially provided in a "normal" (or uncontaminated) state. Hence, the electrical parts 120 may be new parts not previous used in a plasma reaction. Alternatively, the electrical parts 120 may be part having been "just cleaned". The first reference data may be used as a standard or reference map.

The second reference data may be obtained after a chamber 110 and related electrical parts have been used during the generation of a plasma reaction. For example, the second reference data may be ERC measurement data obtained after certain electrical parts 120 have been used for a predetermined amount of time ("cumulative usage time"). Various cumulative usage times may be variously associated with preventive maintenance operations, for example.

In this regard, FIG. 3 is a collection of graphs illustrating certain relationships between electric reflection coefficients and control signal frequency.

Figure 3A:
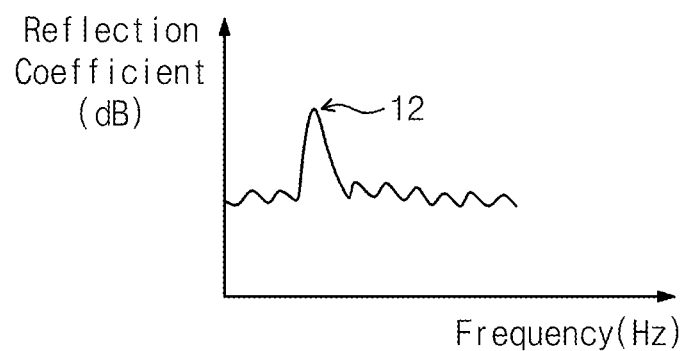
FIG. 3, inclusive of FIGS. 3A, 3B and 3C, is a collection of graphs illustrating relationships between certain electric reflection coefficients and signal frequencies.
Figure 3B:
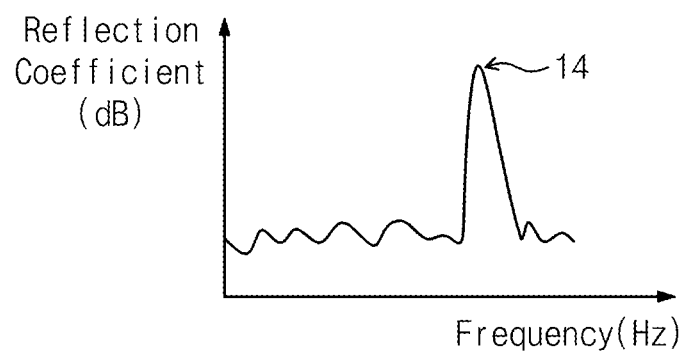
Figure 3C:
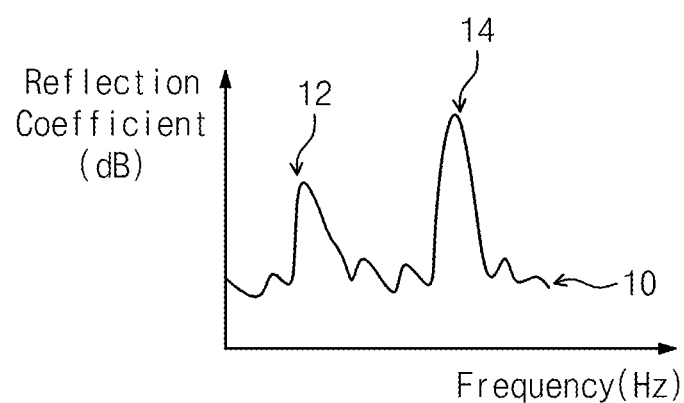

Referring now to FIGS. 1 and 3, the lower electrode 122 is assumed to have a first electric reflection coefficient 12 exhibiting a first peak value in response to a first control signal frequency. The upper electrode 124 is assumed to have a second electric reflection coefficient 14 exhibiting a second peak, higher than the first peak value, in response to a second control signal frequency, higher than the first control signal frequency. Here, in relation to FIGS. 3A and 3B, the first reference data 10 is assumed to include the first electric reflection coefficient 12 and second electric reflection coefficient 14. That is, the first reference data 10 may be calculated through convolution of the first and second electric reflection coefficients 12 and 14, as shown in FIG. 3C.

Returning now to FIG. 2, after obtaining the first and second reference data, an equipment computer 300 may order an operator to perform a preventive maintenance operation (PM) with respect to a chamber 110 and related electrical parts (S120). Hereafter, the phrase "ordering a preventive maintenance operation for a chamber" will be construed as meaning ordering a preventive maintenance operation for a chamber and/or its constituent electrical parts. The preventive maintenance operation may be an operation periodically performed based on the cumulative usage time of the chamber 110 (or the semiconductor manufacturing equipment 100 as a whole). Alternately or additionally, once execution of an abnormal manufacturing process is detected in the semiconductor manufacturing equipment 100, a preventive maintenance operation may be ordered. Assuming that information regarding the ordered preventive maintenance operation is provided to an operator via a display device (not shown), the equipment computer 300 may actuate an alarm device (not shown) when the preventive maintenance operation should be performed by the operator. For example, during one class of preventive maintenance operations, a chambers 110 and its related electrical parts 120 may subjected to a wet cleaning process, and/or the electrical parts 120 may be replaced with new electrical parts.

Following execution of the ordered preventive maintenance operation, the chamber 110 and its electrical parts 120 may be assessed to ascertain the effectiveness of the preventive maintenance operation (S130). For example, the effectiveness of the preventive maintenance operation may be assessed by an equipment computer 300 using a pre-screening method. By use of a pre-screening method, it is possible to assess the effectiveness of the preventive maintenance operation before a plasma reaction is generated (or again generated) in the chamber 110. Thus, by execution of a pre-screening method, it is possible to prevent failure of a semiconductor manufacturing process conducted in the chamber, because the semiconductor manufacturing equipment 100 are not operated in an un-assessed state. Further, use of a pre-screening method may reduce the time otherwise needed to assess the failure of the preventive maintenance operation (e.g., as compared with a conventional visual or optical examination method). Accordingly, methods of managing the preventative maintenance of semiconductor manufacturing equipment according to embodiments of the inventive concept allow increased production yield and greater productivity.

In the illustrated example of FIG. 2, the assessment of the preventive maintenance operation (S130) include the steps of obtaining first measurement data (S132) and then determining whether or not the preventive maintenance operation was normally finished (S134). Here, the phrase "determining whether or not the preventive maintenance operation was normally finished using electric reflection coefficients obtained in relation to the chamber in the absence of a plasma reaction" should be construed as making such a determination for the chamber and/or its constituent electrical parts.

During the step of obtaining the first measurement data (S132), the equipment computer 300 may be used to obtain first ERC measurement data using the electric reflection coefficient measuring instrument 200.

Figure 4:
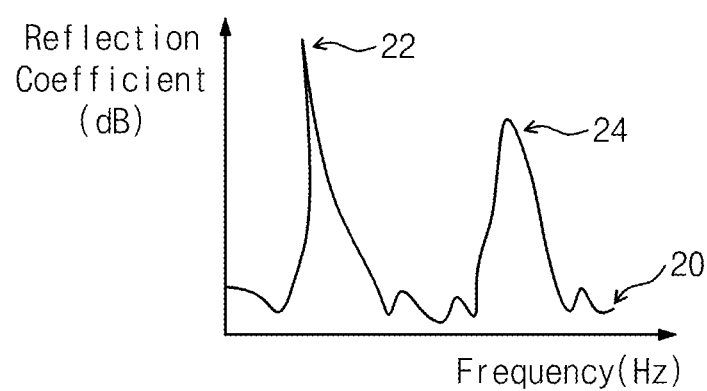
FIG. 4 is a graph illustrating measurement data obtained from semiconductor manufacturing equipment following ineffective preventive maintenance.

FIG. 4 is a graph illustrating first measurement data obtained from semiconductor manufacturing equipment 100 after a preventive maintenance operation was abnormally finished.

In the example shown in FIG. 4 and in comparison with the reference data shown in FIG. 3C, the first measurement data 20 includes a third electric reflection coefficient 22 having a third peak value corresponding to the first control signal frequency, and a fourth electric reflection coefficient 24 having a fourth peak corresponding to the second frequency of the control signal. Here, the third electric reflection coefficient 22 is obtained from the lower electrodes 122, and the fourth electric reflection coefficient 24 is obtained from the upper electrodes 124. Hence, the first measurement data 20 may be calculated through convolution of the third and fourth electric reflection coefficients 22 and 24.

During the step of determining whether or not the preventive maintenance operation was normally finished (S134), a comparison of the first reference data 10 with the first measurement data 20 may be conducted. The first reference data 10 and the first measurement data 20 may be expressed as respective "frequency maps" in which certain peak values are exhibited for corresponding electric reflection coefficients. The frequency maps for the first reference data 10 and first measurement data 20 may be compared using one of several conventionally understood pattern matching methods.

For example, a pattern matching method may be used wherein two frequency maps corresponding to the first reference data 10 and first measurement data 20 are overlapped and compared. If the frequency maps are substantially the same (S134=Yes), it may be concluded that the preventive maintenance operation was normally finished. However, if the frequency maps are substantially different, it may be concluded that the preventive maintenance operation was not normally finished (S134=No), and the preventive maintenance operation may be re-ordered (S120).

Figure 5:
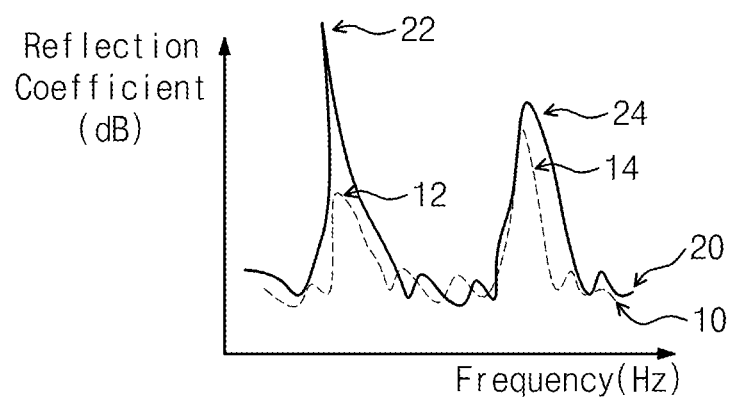
FIG. 5 is a graph illustrating overlapping curves for reference data and the measurement data of FIG. 4.

FIG. 5 is a graph illustrating a pattern matching method that overlaps two frequency maps related to the first reference data 10 and first measurement data 20.

As may be seen from FIG. 5, the first electric reflection coefficient 12 of the first reference data 10 has a peak whose magnitude is different from that of the third electric reflection coefficient 22 of the first measurement data 20. Thus, a re-order of the preventive maintenance operation may be communicated by the equipment computer 300 to an operator of the semiconductor manufacturing equipment 100 (S120).

The equipment computer 300 may then collect information on the electrical parts 120 with respect to the preventive maintenance operation failure based on the difference between the first reference data 10 and first measurement data 20, and may thereafter provide the information to the semiconductor manufacturing equipment 100. For example, in the illustrated case of FIG. 5 where the first and third electric reflection coefficients 12 and 22 are different from each other, an equipment computer 300 may determine that the preventive maintenance operation specifically failed in relation to the lower electrode 122 (i.e., the a coupling failure, cleaning failure, and/or defect failure has occurred in relation to the lower electrode 122). The preventive maintenance operation may again be performed by the operator. In this sense, the equipment computer 300 may be used to monitor in real time the results of preventative maintenance processes in the semiconductor manufacturing equipment.

Returning now to FIGS. 1 and 2, if the preventive maintenance operation is normally finished (S134=Yes), a seasoning process of predetermined duration may be performed for a chamber 110 using a generated plasma field (S140). During the seasoning process, a polymer layer is deposited on inner surface(s) of the chamber 110 and its associated electrical parts 120. During or after the seasoning process, a bare wafer may be loaded in the chamber 100.

Thereafter, a semiconductor manufacturing process may be performed in the seasoned chamber 110 (S150). Operating time for the semiconductor manufacturing process may be classified as "run time" period(s) (S152) and an "idle time" period(s) (S154). A plasma reaction process may be performed in the chamber 110 during run time(s) extending (e.g.,) from about 10 minutes to about 1 hour. Idle time(s) are various waiting periods such as period during which a wafer is being loaded or unloaded from the chamber 110, etc. During certain idle time(s), air may be pumped from the chamber 110, and/or a plasma may not be generated in the chamber 110. Idle time(s) may range from about 20 minutes to about 40 minutes.

During and/or following execution of the semiconductor manufacturing process (150), the equipment computer 300 may be used to evaluate the results of the semiconductor manufacturing process (S160). For example, certain aspects of the evaluation S160 may be conducted during idle time periods of the semiconductor manufacturing process (S154). The evaluation of the semiconductor manufacturing process (16) may include the steps of obtaining second measurement data (S162), determining whether or not the manufacturing process was normally performed (S164), updating a health index for the chamber 110 and related electric al parts 120 (S166), and checking on the period of one or more preventive maintenance operations (S168).

Step S162 may be performed in the absence of plasma in the chamber 110. In certain embodiments, the second measurement data may be the same as the first measurement data.

Step S164 may include comparing the second measurement data with the second reference data. In the case where the second measurement data is different from the second reference data, the equipment computers 300 may determine that the semiconductor manufacturing process was abnormally performed. The equipment computer 300 may order the operator to perform a preventive maintenance operation for the semiconductor manufacturing equipment 100 (S120) if the semiconductor manufacturing process was not normally performed (S164=No). By contrast, in the case where the second measurement data is coincident with the second reference data, the equipment computers 300 may determine that the semiconductor manufacturing process is normally performed (S164=Yes).

The second measurement data and the second reference data may be changed depending on a cumulative usage time of the chamber 110 and/or its electrical parts 120. The second reference data may include information associated with an establish health index for the chamber. Various health indexes may be obtained using a variety of known statistical methods.

Thus, the updating of the health index (S166) may be performed whenever a manufacturing process is normally performed. In general, the second measurement data obtained during a previous idle time may be used as the health index for a current idle time. Whenever step S164 is performed, the health index and the second measurement data may be compared with each other. In other words, the second measurement data in the previous idle time may be compared with the second measurement data in the corresponding idle time. If the health index is different from the second measurement data, the equipment computers 300 may order the operator to perform the preventive maintenance to the semiconductor manufacturing equipment 100 (S120). If the health index is coincident with the second measurement data, the health index may be updated in such a way that it is replaced with the second measurement data (S166).

Further, the health index may include a control limit line. The control limit line may serve as a reference for evaluating the second measurement data. If the second measurement data is outside the control limit line, the equipment computer 300 may order the operator to perform a preventive maintenance operation for the semiconductor manufacturing equipment 100 (S120). However, if the second measurement data is not outside the control limit line, the equipment computer 300 will update the health index (S166), check the period of one or more periodically performed preventive maintenance operations (S168), and then, perform a next manufacturing process using the semiconductor manufacturing equipment 100 (S150).

Step S168 may include determining whether a cumulative usage time for the chambers 110 has reached a predetermined limit. In a normal case, a preventive maintenance operation may be periodically performed when the cumulative usage time for the chamber 110 and/or its electrical parts 120 reaches a predetermined limit, or when a number of wafer lots have been processed. In cases where no preventive maintenance operation period has been reached, steps S150 and S160 may be repeatedly performed.

If however, when the period for a preventive maintenance operation is reached, the equipment computer 300 may determine whether or not to stop the manufacturing process (S170), and order the operator to perform a preventive maintenance operation (S120). The manufacturing process may be stopped because of contamination deterioration in the chamber 110, or due to a change in the type of the semiconductor device being processed. And even if the manufacturing process currently being run in the chamber 110 is not stopped, a preventive maintenance operation for the chamber 110 may be ordered (S120).

Figure 6:
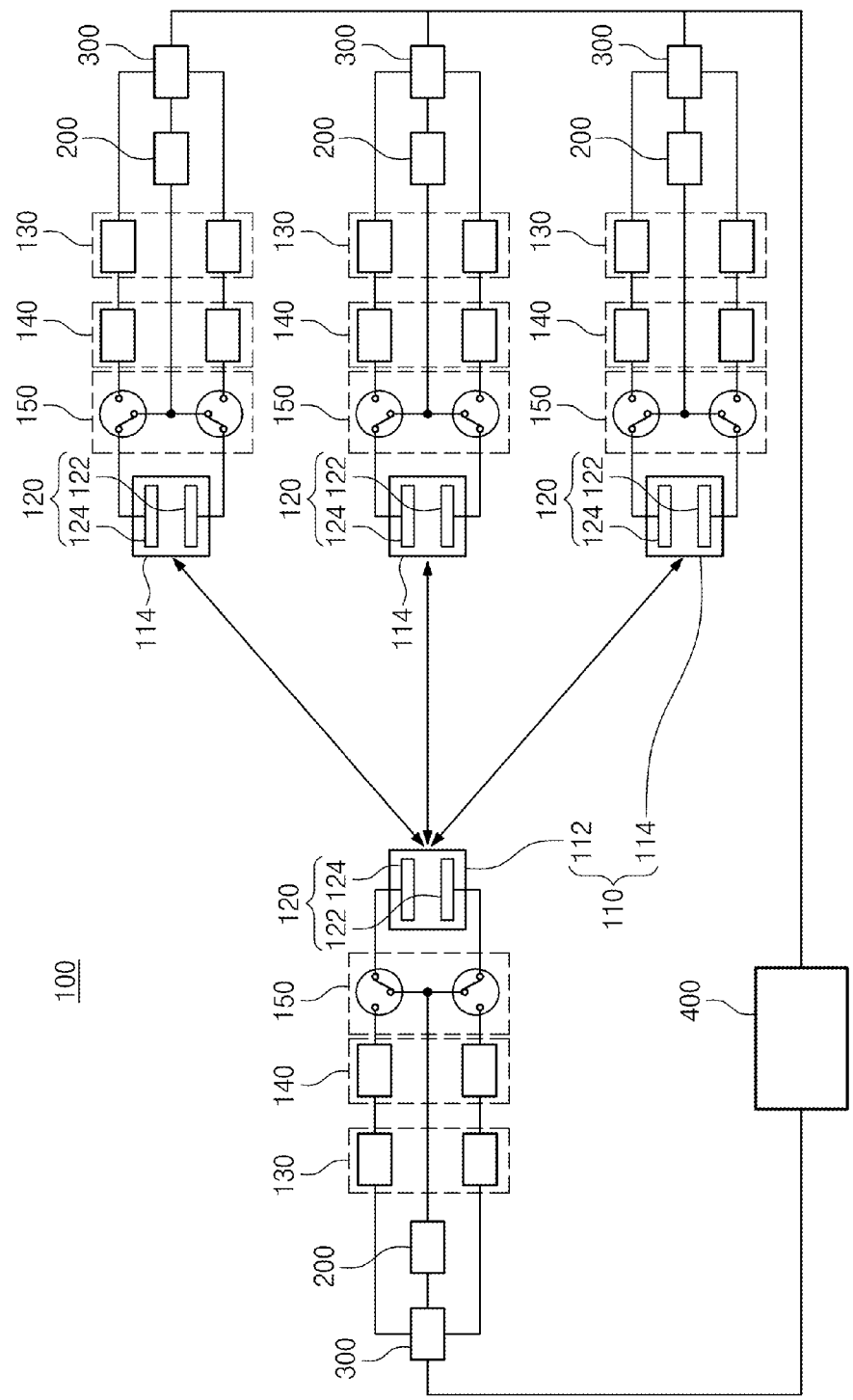
FIG. 6 is a block diagram illustrating a semiconductor manufacturing management system according to an embodiment of the inventive concept.

FIG. 6 is a block diagram illustrating a semiconductor manufacturing management system according to certain embodiments of the inventive concept.

Referring to FIG. 6, the semiconductor manufacturing equipment 100 includes a number of chambers 110 further including a "golden chamber" 112 and a number of measurement chambers 114. The golden chamber 112 may be selected from among the chambers 110 as having the most normal performance. The golden chamber 112 may be used to provide the second reference data to an equipment computer 300.

In such a configuration, the golden chamber 112 may be selected from among the other chambers 110 as being best able to manufacture high-quality semiconductor devices. The second reference data (and corresponding electric reflection coefficient(s)) may be obtained from the golden chamber 112 and communicated to the equipment computers 300 and/or the server 400 as reference data. For example, the golden chamber 112 may be selected on the basis of cumulative usage time in relation to one or more preventive maintenance operations (e.g., cumulative usage time ranging from between about 100 hours to about 300 hours). Hence, the equipment computers 300 and/or server 400 may select the measurement chambers 114 for execution of a preventative maintenance operation when its cumulative usage time reaches a predetermined cumulative usage time associated with the golden chamber 112.

Accordingly, the equipment computers 300 may be configured to classify the chambers 110 as a golden chamber 112 or a measurement chamber 114 depending on the usage time or age of the chamber 110, etc. According to the second embodiments, each of the chambers 110 according to the first embodiments may be used as the golden chamber 112 or a measurement chamber 114.

The first and second measurement data obtained from the measurement chambers 114 may be communicated to the equipment computers 300, and compared with the second reference data. Thus, the equipment computers 300 may evaluate the results of a semiconductor manufacturing process based on a comparison between the second measurement data and second reference data.

Figure 7:
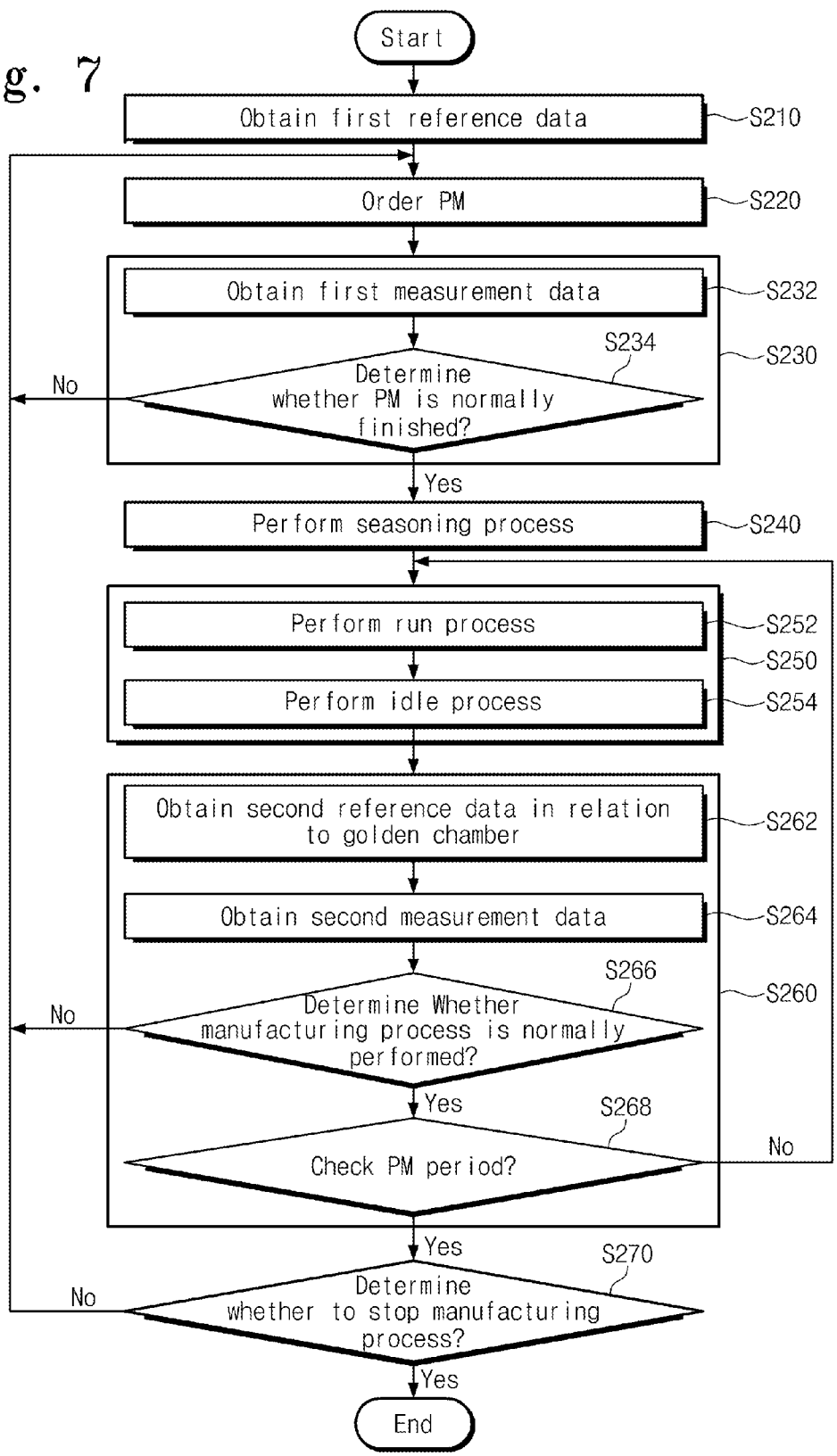
FIG. 7 is a flow chart summarizing in one example a method of managing the semiconductor manufacturing system of FIG. 6.

FIG. 7 is a flow chart summarizing in another example a method of managing the preventative maintenance of semiconductor manufacturing equipment according to embodiments of the inventive concept.

The steps (S2XX) illustrated in the method of FIG. 7 are analogous and identical to the steps (S1XX) illustrated in FIG. 2, except the step S262 of obtaining the second reference data may include detecting one or more electric reflection coefficients associated with the golden chamber 112 and its electrical parts 120. Here, the equipment computers 300 may obtain the second reference data when the golden chamber 112 is at the idle time.

Figure 8:
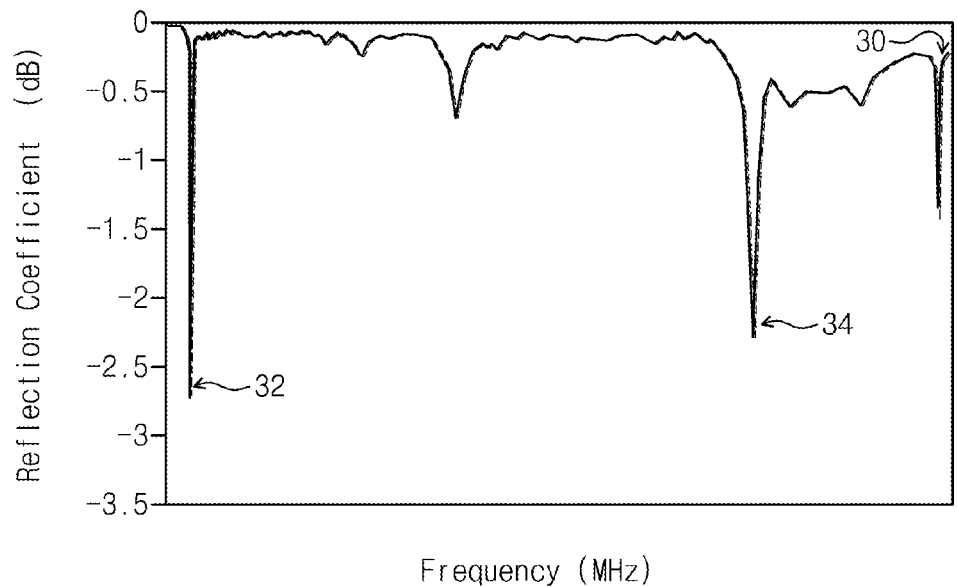
FIG. 8 is a graph illustrating certain reference data that may be used in a method of managing a semiconductor manufacturing system according to an embodiment of the inventive concept.

FIG. 8 is a graph illustrating in one possible example the second reference data 30.

Referring to FIGS. 6, 7 and 8, the second reference data 30 may include a fifth electric reflection coefficient 32 and a sixth electric reflection coefficient 34. The fifth electric reflection coefficient 34 may have a fifth peak at a first frequency. The fifth electric reflection coefficient 34 may provide information on a state of the lower electrode 122 in the golden chamber 112. The sixth electric reflection coefficient 34 may have a sixth peak, which is lower than the fifth peak and is positioned at a second frequency greater than the first frequency. The sixth electric reflection coefficient 34 may provide information on the upper electrode 124 in the golden chamber 112.

The step S264 may include detecting one or more electric reflection coefficients associated with a measurement chambers 114 and its electrical parts 120. The equipment computers 300 may obtain the second measurement data when the measurement chamber 114 is in an idle time.

The step S266 may include comparing the second measurement data with the second reference data. In the case where the second measurement data is different from the second reference data, the equipment computers 300 may determine that the semiconductor manufacturing process will be abnormally performed in the measurement chambers 114. In this case, the equipment computers 300 may order the operator to perform the preventive maintenance to the measurement chambers 114 and the electrical parts 120 in the measurement chambers 114 (S220). By contrast, in the case where the second measurement data is coincident with the second reference data, the equipment computers 300 may determine that the semiconductor manufacturing process using the measurement chambers 114 is normally performed.

Figure 9:
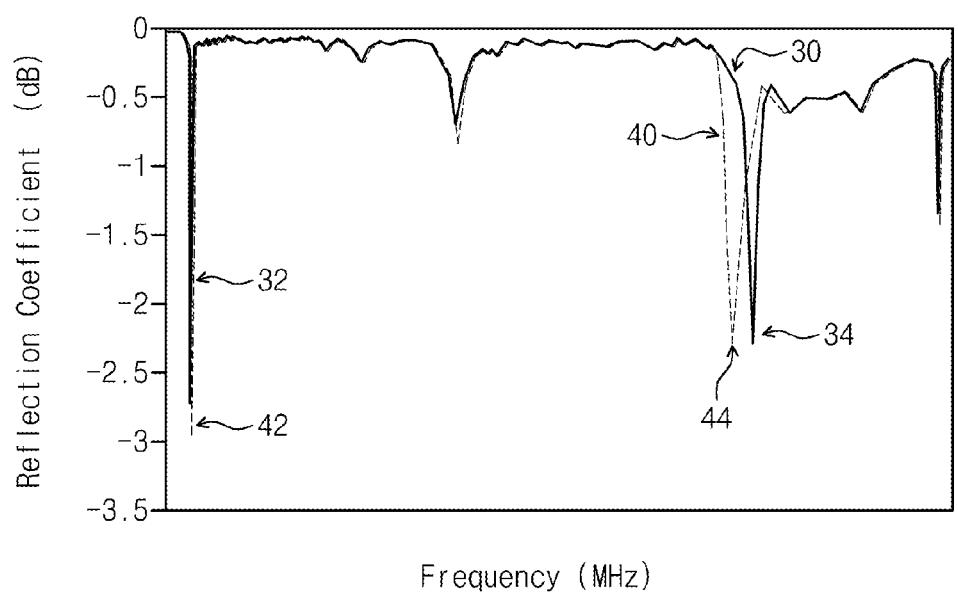
FIG. 9 is a graph illustrating overlapping curves for the reference data of FIG. 8 and related measurement data.

FIG. 9 is a graph showing overlapped frequency maps for the second reference data 30 and second measurement data 40.

Referring to FIGS. 6, 7, 8 and 9, the sixth electric reflection coefficient 34 of the second reference data 30 may not be coincident with the eighth electric reflection coefficient 44 of the second measurement data 40. In this case, the equipment computers 300 may conclude that there is a failure in the electrical parts 120 of the measurement chamber 114, and then may order an operator to perform a preventive maintenance operation directed to the measurement chamber 114 and/or its electrical parts 120.

For example, the second measurement data 40 may include a seventh electric reflection coefficient 42 and an eighth electric reflection coefficient 44. The seventh electric reflection coefficient 42 may contain information on the lower electrode 122 in the measurement chamber 114. The eighth electric reflection coefficient 44 may contain information on the upper electrode 124 in the measurement chamber 114.

If the sixth electric reflection coefficient 34 is different from the eighth electric reflection coefficient 44, the equipment computers 300 may order the operator to perform the preventive maintenance to the upper electrode 124 of the measurement chamber 114. A coupling failure, a cleaning failure, and a defect failure may occur on the upper electrode 124. Accordingly, the equipment computer 300 may be used to monitor in real time the results of a semiconductor manufacturing process performed by the semiconductor manufacturing equipment 100.

Although not shown in the flowchart of FIG. 7, a step of selecting the golden chamber 112 may be further performed after the step S266.

The step S268 may include determining whether a cumulative usage time of the measurement chambers 114 reaches a predetermined time. In the case where it is not in the period for the preventive maintenance, the steps S250 and S260 may be repeatedly performed.

If it is in the period for the preventive maintenance, the equipment computers 300 may determine to stop the use of the manufacturing process (S270), and order the operator to perform the preventive maintenance to the chambers 110 and the electrical parts 120 (S220). The manufacturing process may be stopped because of deterioration of the chambers 110 or a change in type of the semiconductor device to be processed thereby. If the manufacturing process using the chambers 110 is not stopped, the preventive maintenance to the chambers 110 may be ordered (S220).

According to certain embodiments of the inventive concept, methods and systems for managing semiconductor manufacturing equipment may be configured may control the timely execution and assessment of a preventive maintenance operation performed in relation to one or more chamber and/or their related electrical parts. A pre-screening method may be used for assessment, wherein certain electric reflection coefficient are detected in the absence of a plasma reaction in the chamber(s). Such results may be compared with reference data previously measured. By using the pre-screening method, it is possible to prevent failure of the semiconductor manufacturing process. Further, the pre-screening method can reduce time required to assess the effectiveness of the preventive maintenance, as compared with conventional optical examination methods. Accordingly, the management method and system make it possible to increase production yield and productivity of the semiconductor manufacturing equipment.

While example embodiments of the inventive concepts have been particularly shown and described, it will be understood by one of ordinary skill in the art that variations in form and detail may be made therein without departing from the scope of the attached claims.

What is claimed is:

1. A method of managing semiconductor manufacturing equipment using an equipment computer, comprising:
   ordering, by an equipment computer, a preventive maintenance operation for a chamber in semiconductor manufacturing equipment, wherein the chamber is configured with a lower electrode being disposed in a lower portion of the chamber, and an upper electrode being disposed in an upper portion of the chamber;
   determining, by the equipment computer, whether or not the preventive maintenance operation was normally finished using first electric reflection coefficients obtained by a measuring instrument in relation to the chamber by applying a control signal with varying frequencies to the chamber in the absence of a plasma reaction, wherein the determining is configured with the lower electrode being connected to the upper electrode by a plurality of switches, and the measurement instrument being connected between the plurality of switches; and then, only after determining that the preventive maintenance operation was normally finished, performing a semiconductor manufacturing process using a plasma reaction in the chamber of the semiconductor manufacturing equipment, wherein the equipment computer obtains the electric reflection coefficients from the measuring instrument when the measuring instrument is directly connected to the lower electrode and the upper electrode through the plurality of switches.

2. The method of claim 1, further comprising:
obtaining first reference data for the chamber before generating a plasma reaction,
wherein the first reference data comprises an electric reflection coefficient associated with an electrical part of the chamber.

3. The method of claim 2, wherein the determining whether or not the preventive maintenance operation was normally finished comprises:
obtaining first measurement data for the electrical part of the chamber after executing the preventive maintenance operation; and thereafter,
comparing the first measurement data with the first reference data using a pre-screening method to determine whether the preventive maintenance was normally finished.

4. The method of claim 3, further comprising:
when the first measurement data and the first reference data are different, re-ordering the preventive maintenance operation.

5. The method of claim 3, further comprising:
expressing the first reference data as a first frequency map having a first peak value associated with an electric reflection coefficient; and
expressing the first measurement data as a second frequency map having a second peak value associated with the electric reflection coefficient,
wherein the pre-screening method uses a pattern matching method to compare an overlap between the first and second frequency maps.

6. The method of claim 1, further comprising:
determining whether or not the semiconductor manufacturing process was normally performed.

7. The method of claim 6, wherein the semiconductor manufacturing process comprises a run time period during which the plasma reaction is induced in the chamber; and
an idle time period during which the plasma reaction is not induced in the chamber,
wherein the determining of whether or not the semiconductor manufacturing process was normally performed is performed during the idle time period.

8. The method of claim 6, further comprising:
obtaining second reference data for the chamber, wherein the second reference data comprises an electric reflection coefficient associated with an electrical part of the chamber.

9. The method of claim 8, wherein the determining of whether or not the semiconductor manufacturing process was normally performed comprises:

obtaining second measurement data for the electrical part of the chamber after executing the preventive maintenance operation;
comparing the second measurement data with second reference data to determine whether the semiconductor manufacturing process was normally performed; and then,
checking whether a period for a periodically performed preventive maintenance operation for the chamber has been reached, upon determining that the semiconductor manufacturing process was normally performed based on the comparing of the second measurement data with second reference data.

10. The method of claim 9, further comprising:
updating a health index for the chamber using the second reference data, if the semiconductor manufacturing process was normally performed.

11. The method of claim 10, further comprising:
if the second measurement data is different from the second reference data indicating that the semiconductor manufacturing process was not normally performed, re-ordering the preventive maintenance operation.

12. The method of claim 9, further comprising:
determining whether to stop operation of the semiconductor manufacturing equipment after checking a result of the semiconductor manufacturing process.

13. The method of claim 8, wherein the obtaining of the second reference data for the chamber comprises:
obtaining the second reference data in relation to a golden chamber selected from among a number of chambers, wherein the second reference data contains electric reflection coefficients associated with the golden chamber.

14. The method of claim 1, further comprising:
executing the preventive maintenance operation for the chamber; and
after determining that the preventative maintenance operation was normally finished, performing a seasoning process for the chamber before the performing of the semiconductor manufacturing process.

15. A management system for semiconductor manufacturing equipment, comprising:
semiconductor manufacturing equipment that includes a chamber, a lower electrode disposed in a lower portion of the chamber, a lower power generator providing a lower power into the lower electrode, a lower matcher connected between the lower electrode and the lower power generator, a lower switch connected between the lower matcher and the lower electrode, an upper electrode disposed in an upper portion of the chamber, an upper power generator providing an upper power into the upper electrode, an upper matcher connected between the upper electrode and the upper power generator, and an upper switch connected between the upper matcher and the upper electrode;
an electric reflection coefficient measuring instrument disposed out of the chamber and connected between the lower switch and the upper switch to provide a control signal with varying frequencies to an electrical part of the chamber; and
an equipment computer configured to control execution of a preventative maintenance operation for the chamber using at least one frequency map obtained by providing the control signal to the electrical part and with a respective frequency exhibiting a peak value in relation to an electric reflection coefficient associated with the electrical part and responsive to the control signal, wherein the equipment computer obtains the electric reflection coefficient from the electric reflection coefficient measuring instrument when the electric reflection coefficient measuring instrument is directly connected to the lower electrode and the upper electrode through the lower switch and the upper switch.

16. The management system of claim 15,
wherein the at least one frequency map includes a first frequency map obtained before a plasma reaction is generated using the electrical part, and a second frequency map obtained after a plasma reaction is generated using the electrical part.

17. A method of managing a preventative maintenance operation to a chamber in an assembly of semiconductor manufacturing equipment, the method comprising:
before running a semiconductor manufacturing operation, ordering by an equipment computer a preventive maintenance operation for a chamber in semiconductor manufacturing equipment, wherein the chamber is configured with a lower electrode being disposed in a lower portion of the chamber, and an upper electrode being disposed in an upper portion of the chamber, then determining, by the equipment computer, whether or not the preventive maintenance operation was normally finished using first electric reflection coefficients obtained by a measuring instrument in relation to the chamber by applying a control signal with varying frequencies to the chamber in the absence of a plasma reaction, wherein the determining is configured with the lower electrode being directly connected to the upper electrode by a plurality of switches, and the measuring instrument being connected between the plurality of switches;
after running the semiconductor manufacturing operation, ordering by an equipment computer the preventive maintenance operation for the chamber upon determining that the semiconductor manufacturing operation was not normally performed, and then determining whether or not the preventive maintenance operation was normally finished using second electric reflection coefficients obtained by the measuring instrument in relation to the chamber by applying a control signal with varying frequencies to the chamber in the absence of a plasma reaction; and
after running the semiconductor manufacturing operation using the semiconductor manufacturing equipment, ordering by the equipment computer the preventive maintenance operation for the chamber upon determining that a period for the preventive maintenance operation has been reached, and then determining whether or not the preventive maintenance operation was normally finished using third electric reflection coefficients obtained by the measuring instrument in relation to the chamber by applying a control signal with varying frequencies to the chamber in the absence of a plasma reaction,
wherein the equipment computer obtains the first electric reflection coefficients, the second electric reflection coefficients and the third electric reflection coefficients from the measuring instrument when the measuring instrument is directly connected to the lower electrode and the upper electrode through the plurality of switches.

18. The method of claim 17, wherein determining whether or not the preventive maintenance operation was normally finished comprises:
obtaining first measurement data for an electrical part of the chamber after ordering the preventive maintenance operation; and thereafter,
comparing the first measurement data with first reference data using a pre-screening method to determine whether the preventive maintenance was normally finished.

19. The method of claim 18, further comprising:
expressing the first reference data as a first frequency map having a first peak value associated with an electric reflection coefficient; and
expressing the first measurement data as a second frequency map having a second peak value associated with the electric reflection coefficient,
wherein the pre-screening method uses a pattern matching method to compare an overlap between the first and second frequency maps.

* * * * *